US008736041B2

(12) United States Patent
Okamura

(10) Patent No.: US 8,736,041 B2
(45) Date of Patent: May 27, 2014

(54) POWER CONVERTER

(71) Applicant: Denso Corporation, Kariya (JP)

(72) Inventor: Makoto Okamura, Nisshin (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/799,702

(22) Filed: Mar. 13, 2013

(65) Prior Publication Data
US 2013/0241082 A1 Sep. 19, 2013

(30) Foreign Application Priority Data

Mar. 13, 2012 (JP) .................................. 2012-056064

(51) Int. Cl.
H01L 23/48 (2006.01)
(52) U.S. Cl.
USPC .......................................... 257/691; 257/692
(58) Field of Classification Search
CPC ...................................................... H02M 7/003
USPC ................................................. 257/691, 692
See application file for complete search history.

(56) References Cited

U.S. PATENT DOCUMENTS

2006/0284308 A1 12/2006 Harada et al.
2008/0164607 A1 7/2008 Harada et al.
2009/0251858 A1 10/2009 Harada et al.
2009/0251859 A1 10/2009 Harada et al.
2010/0226158 A1 9/2010 Yamahira

FOREIGN PATENT DOCUMENTS

JP 2005-073374 3/2005
JP 2010-207059 9/2010
JP 2011-024355 2/2011

OTHER PUBLICATIONS

Office Action (1 page) dated Jan. 14, 2014, issued in corresponding Japanese Application No. 2012-056064 and English translation (2 pages).

*Primary Examiner* — Howard Weiss
*Assistant Examiner* — Tifney Skyles
(74) *Attorney, Agent, or Firm* — Nixon & Vanderhye P.C.

(57) ABSTRACT

A power converter includes a plurality of semiconductor modules that have main body sections, each of the main body sections has a semiconductor element therein, and power terminals projected from the main body sections, and a plurality of bus bars that connect the power terminals of the semiconductor modules. At least one of the plurality of the bus bars are connecting bus bars which have a plurality of terminal connecting sections that connect the power terminals of the plurality of different semiconductor modules, and connecting sections that connect the terminal connecting sections. The entirety of each of the connecting bus bars is formed integrally. The terminal connecting sections and the connecting section of every connecting bus bar are provided alternately in the connecting bus bar, and disposed in substantially the same position in a projecting direction of the power terminals.

7 Claims, 11 Drawing Sheets

POWER CONVERTER

CROSS-REFERENCE TO RELATED APPLICATION

The application is based on and claims the benefit of priority from earlier Japanese Patent Application No. 2012-56064 filed Mar. 13, 2012, the description of which is incorporated herein by reference.

TECHNICAL FIELD

The present disclosure relates to a power converter having a plurality of semiconductor modules that have semiconductor elements.

BACKGROUND

Electric vehicles, hybrid cars and the like are equipped with a power converter that converts direct-current electric power from a power supply into alternating-current electric power in order to drive a driving motor.

A power converter equipped with a plurality of semiconductor modules that have semiconductor elements, and a plurality of bus bars connected to power terminals of the semiconductor modules is disclosed in Japanese Patent Application Laid-Open Publication No. 2010-207059, for example.

In this power converter, the power terminals of the semiconductor modules are connected to the branched-off bus bars.

However, in the power converter disclosed in the document '059, since the bus bars are branched off in order to connect the power terminals of the plurality of semiconductor modules, the shape of the bus bars becomes very complicated.

Therefore, the manufacturing cost becomes high and the ease of assembly is poor.

Moreover, since the bus bars have to be folded or bent in various directions, portions with narrow width to (portion with a small cross-sectional area) are formed in the bus bars, and problems arise that wiring resistance and inductance of the bus bars become high.

SUMMARY

An embodiment provides a power converter that can reduce the manufacturing cost and improve the ease of assembly, and also can reduce wiring resistance and inductance of bus bars.

In a power converter according to a first aspect, the power converter includes a plurality of semiconductor modules that have main body sections, each of the main body sections has a semiconductor element therein, and power terminals projected from the main body sections, and a plurality of bus bars that connect the power terminals of the semiconductor modules.

At least one of the plurality of the bus bars are connecting bus bars which have a plurality of terminal connecting sections that connect the power terminals of the plurality of different semiconductor modules, and connecting sections that connect the terminal connecting sections.

An entirety of each connecting bus bars is formed integrally, and the terminal connecting sections and the connecting section of every connecting bus bar are provided alternately in the connecting bus bar, and disposed in substantially the same position in a projecting direction of the power terminals.

In the power converter, the connecting bus bar has the plurality of terminal connecting sections that connect the power terminals of plurality of different semiconductor modules, and the connecting section that connects terminal connecting sections.

Moreover, the entirety of the connecting bus bar is formed integrally.

Therefore, the power terminals of the plurality of different semiconductor modules can be connected to the connecting bus bars without branching off the connecting bus bars.

Thereby, the connecting bus bar can be formed into a simple shape, and reduction of a manufacturing cost and improvement in an ease of assembly can be realized.

Moreover, the terminal connecting sections and the connecting section of the connecting bus bar are provided alternately in the connecting bus bar, and disposed in substantially the same position in a projecting direction of the power terminals.

Therefore, the terminal connecting sections and the connecting section can be continuously formed with the same width (width of the projecting direction) by connecting terminal connecting sections by the connecting section substantially in the same position in the projecting direction.

Thereby, it becomes unnecessary to fold or bend the connecting bus bar in the various directions, and this can avoid forming a portion with narrow width (portion with a small cross-sectional area) in the connecting bus bar.

As a result, reduction of wiring resistance and inductance of the connecting bus bar can be realized.

Thus, the power converter that can realize reduction of the manufacturing cost and improvement in the ease of assembly, and can also realize reduction of wiring resistance and inductance of the bus bar can be provided.

In the power converter mentioned above, the plurality of power terminals connected to the plurality of terminal connecting sections of the connecting bus bar are used as the terminals that have the same function (for example, the terminals the have the same potential).

For example, the power terminals can be provided between the anode terminals connected to the anode side of a power supply, the cathode terminals connected to the cathode side of the power supply, or the AC (alternating-current) terminals which are connected to the AC load.

The entirety of each of the connecting bus bars is formed integrally.

That is, the entirety of the connecting bus bar is formed integrally from one end to another end without branching off therebetween.

In the power converter according to a second aspect, the plurality of the semiconductor modules are disposed by stacking mutually, and the terminal connecting section of the connecting bus bar is formed with both main surfaces facing in a stacking direction of the semiconductor module in an intersecting direction that intersects perpendicularly with the stacking direction and the projecting direction.

In the power converter according to a third aspect, the plurality of different semiconductor modules connected to the connecting bus bar is disposed so that each module adjoins in the stacking direction.

In the power converter according to a fourth aspect, the power terminals of the plurality of different semiconductor modules connected to the connecting bus bar are disposed in a line along the stacking direction.

In the power converter according to a fifth aspect, the connecting section is formed in the stacking direction, and a pair of terminal connecting sections connected by the connecting section are formed by bending the connecting section to provide at least two portions thereof which are parallel to the intersecting direction.

In the power converter according to a sixth aspect, the connecting bus bar is an alternating-current bus bar connected to an alternating-current load.

DETAILED DESCRIPTION OF THE PREFERRED EMBODIMENTS

With reference to the drawings, hereinafter will be described embodiments of a power converter in which the present disclosure is applied.

In addition, hereafter, a direction where a plurality of semiconductor modules is stacked is defined as a stacking direction X, a direction that intersects with the stacking direction X is defined as an intersecting direction Y, and a direction where a power terminal is projected is defined as a projecting direction Z.

[First Embodiment]

Figure 1:
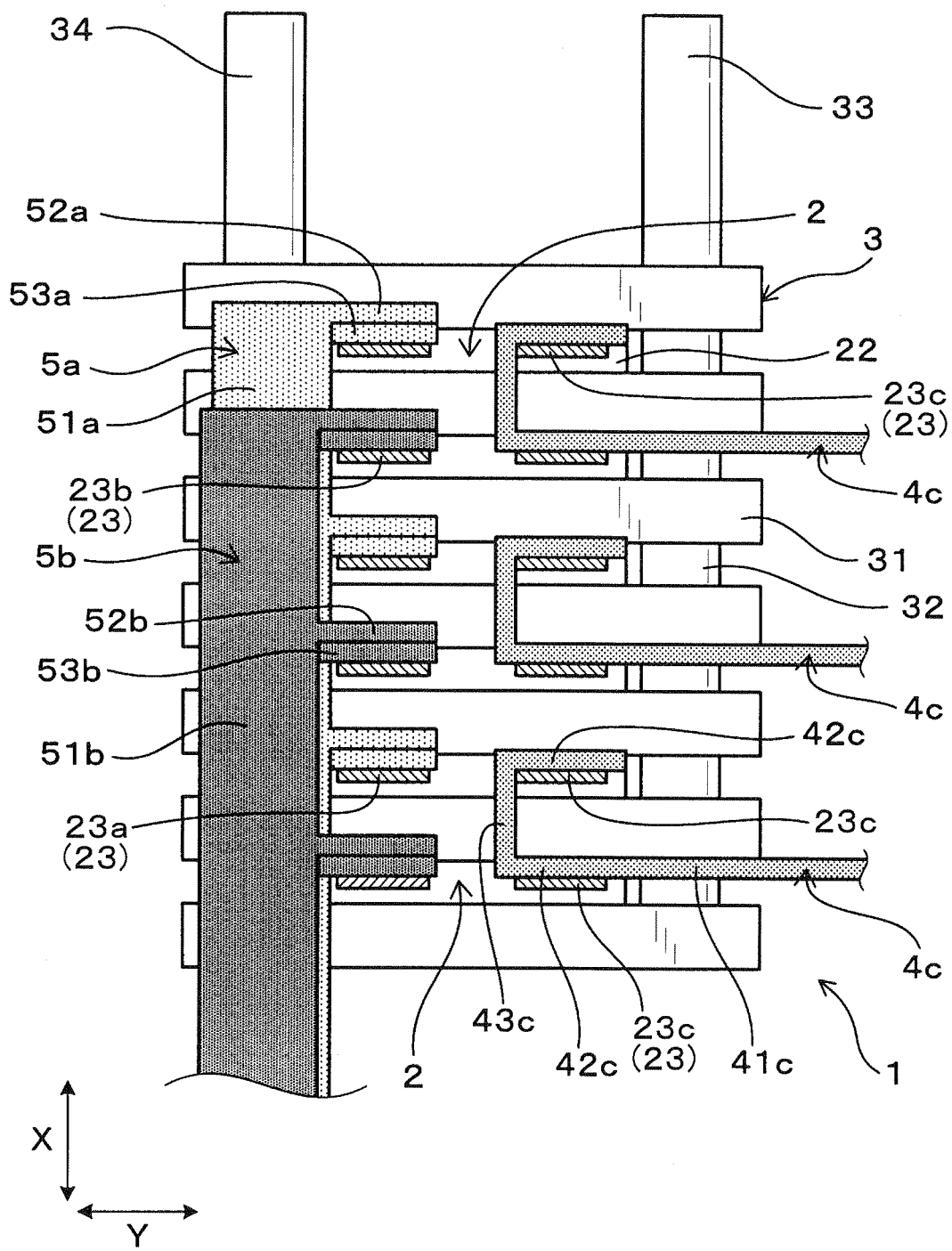
FIG. 1 shows a plan view of an entire structure of a power converter in a first embodiment.
Figure 2:
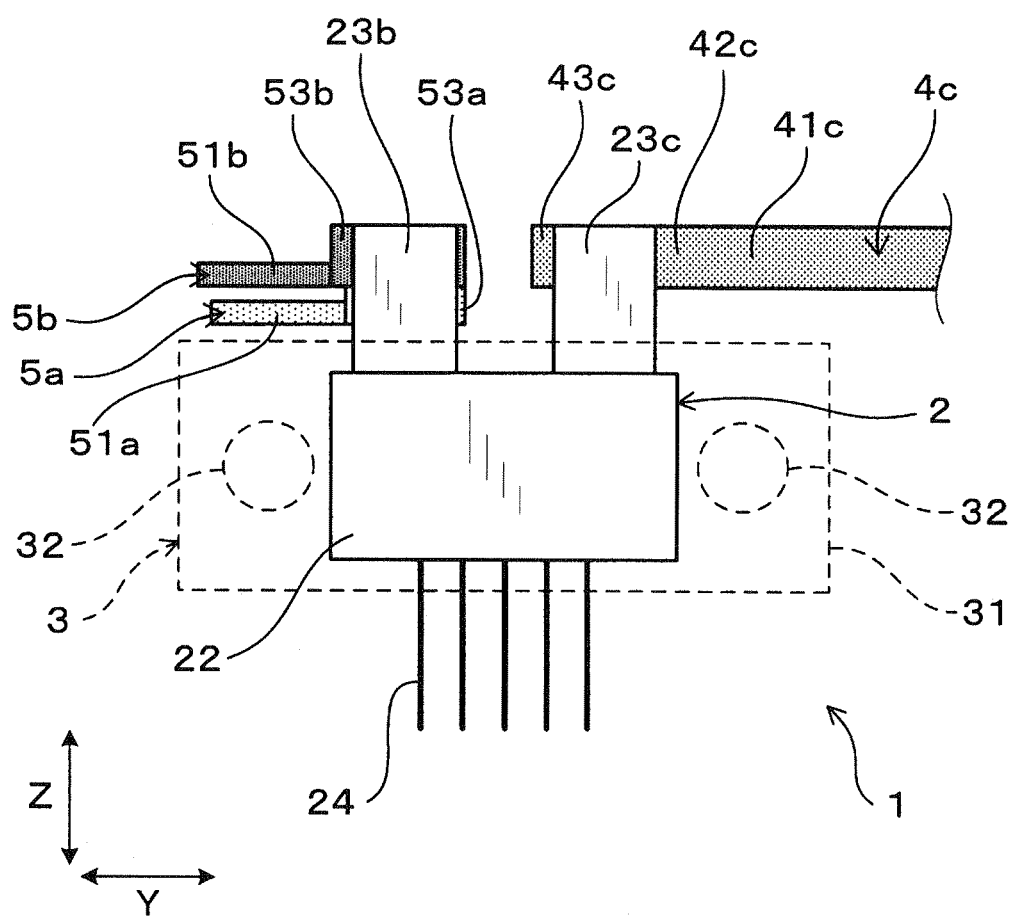
FIG. 2 shows a diagram of the power converter seen from one side in a stacking direction in the first embodiment.

As shown in FIG. 1 and FIG. 2, a power converter 1 of the present embodiment has a plurality of semiconductor modules 2 that have main body sections 22 and a plurality of bus bars 4c, 5a, and 5b.

Each of the main body sections 22 has a semiconductor element 21 (see FIG. 4) therein, and power terminals 23 projected from the main body sections 22. The bus bars 4c, 5a, and 5b are connected to the power terminals 23.

At least one of the plurality of bus bars 4c, 5a, and 5b are connecting bus bars 4c that have a plurality of terminal connecting sections 42c that connect the power terminals 23 of the different semiconductor modules 2, and connecting sections 43c that connect the terminal connecting sections 42c.

The entirety of each of the connecting bus bars 4c is formed integrally.

The terminal connecting sections 42c and the connecting section 43c of every connecting bus bar 4c are provided alternately in the connecting bus bar 4c, and disposed in substantially the same position in a projecting direction Z of the power terminals 23.

Hereinafter, full detail is provided.

As shown in FIG. 1 and FIG. 2, the power converter 1 has the plurality of semiconductor modules 2. a cooler 3 for cooling the semiconductor modules 2, the plurality of bus bars (an anode bus bar 5a, a cathode bus bar 5b, and an AC (alternating-current) bus bar 4c, which are mentioned later), etc., and is constituted by accommodating parts mentioned above in a case (not shown).

The plurality of the semiconductor modules 2 are disposed by stacking mutually in a stacking direction X.

As the semiconductor element 21, each semiconductor module 2 has a switching element 211 (FIG. 4) consisting of IGBT (insulated-gate type bipolar transistor) or the like and a diode 212 (FIG. 4) consisting of a FWD (freewheel diode) or the like connected in reverse-parallel to the switching element 211.

The switching element 211 and the diode 212 are built in the main body section 22.

Figure 3:
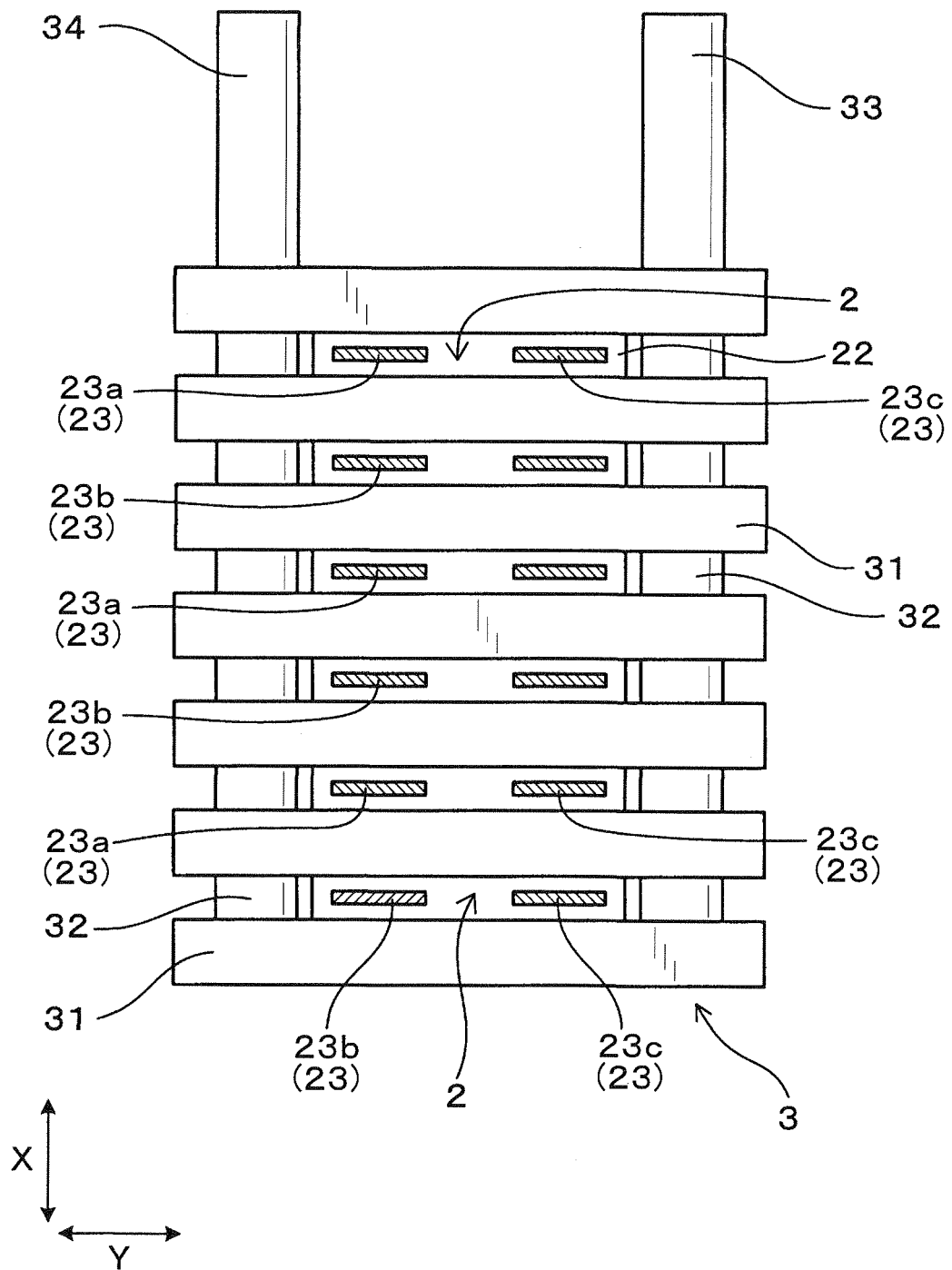
FIG. 3 shows plan views of a semiconductor module and a cooler in the first embodiment.

As shown in FIG. 3, each semiconductor module 2 has two power terminals 23.

The two power terminals 23 are formed projecting from the main body section 22.

Moreover, the two power terminals 23 are disposed along with an intersecting direction Y in the main body section 22.

Moreover, one of the power terminals 23 is either an anode terminal 23a connected to the anode bus bar 5a or a cathode terminal 23b connected to the cathode bus bar 5b.

Moreover, another one of the power terminals 23 is an AC (alternating-current) terminal 23c connected to the AC bus bar 4c.

There are semiconductor modules 2 that have the anode terminals 23a and the AC terminals 23c, and semiconductor modules 2 that have the cathode terminals 23b and the AC terminals 23c in the plurality of semiconductor modules 2, and these are disposed alternately in the stacking direction X.

Moreover, a plurality of anode terminals 23a and cathode terminals 23b in the semiconductor module 2 are disposed alternately in one line in the stacking direction X.

Further, the AC terminals 23c are disposed in one line in the stacking direction X.

As shown in FIG. 2, each semiconductor module 2 has a plurality of control terminals 24 connected to a control circuit board (not shown).

The plurality of control terminals 24 is formed by projecting to a side opposite to the power terminal 23 in the projecting direction Z from the main body section 22.

A control circuit that controls switching operation of the switching element 211 in the semiconductor module 2 is formed in the control circuit board.

As shown in FIG. 3, the cooler 3 has a plurality of cooling tubes 31 that circulate the coolant that cools the semiconductor modules 2.

The semiconductor modules 2 and the cooling tubes 31 are disposed alternately in the stacking direction X.

Each semiconductor module 2 is sandwiched by the cooling tubes 31 from both sides in the stacking direction X.

The cooling tubes 31 next to each other in the stacking direction X are connected at both ends with deformable connecting tubes 32.

Moreover, a coolant introduction pipe 33 for introducing the coolant from outside and a coolant discharge pipe 34 for discharging the coolant outside are connected with the both ends of the cooling tube 31 disposed among the plurality of cooling tubes 31 at an end of the stacking direction X.

In the cooler 3, the coolant introduced into the coolant introduction pipe 33 from outside passes through the connecting tubes 32 in the coolant introduction pipe 33 side, and flows through inside each cooling tube 31.

The coolant that flows inside of each cooling tube 31 exchanges heat with the semiconductor modules 2.

The coolant after heat exchange passes through the connecting tubes 32 in the coolant exhaust pipe 34 side, and is discharged outside from the coolant exhaust pipe 34.

In addition, as a coolant that flows through the inside of the cooler 3, a natural coolant such as water or ammonia, water mixed with an antifreeze solution of the ethylene glycol base, a fluorocarbon-based coolant such as a FLUORINERT (Trade Mark), Freon-based coolant such as HCFC123 or HFC134a, an alcohol-based coolants such as methanol or alcohol, and a ketone-based coolants such as acetone can be used, for example.

Figure 4:
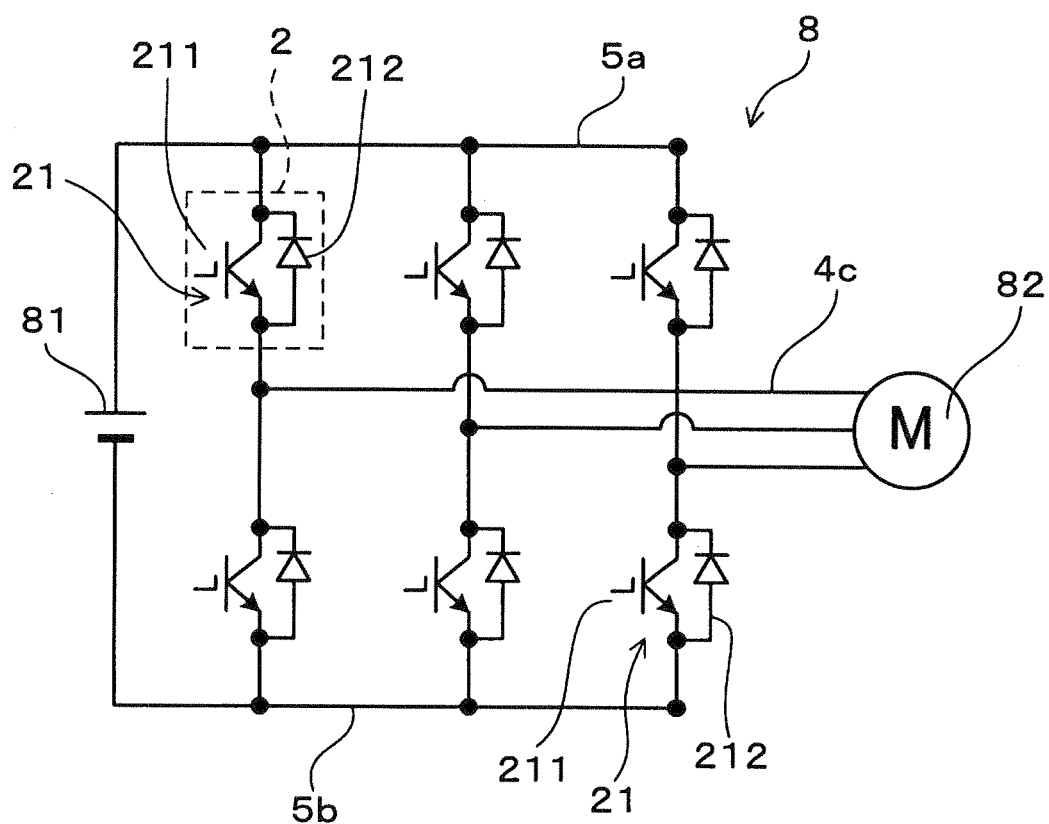
FIG. 4 shows an electric circuit of the power converter in the first embodiment.

As shown in FIG. 1 and FIG. 2, in the plurality of bus bars, there are the anode bus bar 5a connected to the anode side of a power supply 81 (FIG. 4), the cathode bus bar 5b connected to the cathode side of the power supply 81 (FIG. 4), and three AC bus bars 4c connected to an AC (alternating-current) load 82 (FIG. 4). In addition, the connecting bus bar of the present embodiment is the AC bus bar 4c.

As shown in FIG. 1 and FIG. 2, the anode bus bar 5a has a tabular main body section 51a disposed where both main surfaces are facing in the projecting direction Z, three projecting portions 52a projected in the intersecting direction Y from the main body section 51a, and the standing portion 53a that stands in the projecting direction Z from each projecting portion 52a.

The cathode bus bar 5b has, like the anode bus bar 5a, a tabular main body section 51b disposed where both main surfaces are facing in the projecting direction Z, three projecting portions 52b projected in the intersecting direction Y from the main body section 51b, and the standing portion 53b that stands in the projecting direction Z from each projecting portion 52b.

The main body section 51a of the anode bus bar 5a and the main body section 51b of the cathode bus bar 5b are disposed so as to overlap mutually in the projecting direction Z.

The anode terminal 23a of the semiconductor module 2 is connected to the standing portion 53a of the anode bus bar 5a.

Moreover, the cathode terminal 23b of the semiconductor module 2 is connected to the standing portion 53b of the cathode bus bar 5b.

As shown in FIG. 1 and FIG. 2, the AC bus bar 4c has a main body section 41c, two terminal connecting sections 42c that connect the AC terminals 23c of the two different semiconductor modules 2, and a connecting section 43c that connects the two terminal connecting sections 42c.

Moreover, the entirety of the AC bus bar 4c is formed integrally.

That is, the main body section 41c, the terminal connecting section 42c, the connecting section 43c, and the terminal connecting section 42c continue in this order to form the AC bus bar 4c.

The two terminal connecting sections 42c are formed in the intersecting direction Y with both main surfaces facing in the stacking direction X.

The connecting section 43c is formed in the stacking direction X with both main surfaces facing in the intersecting direction Y.

Moreover, the terminal connecting sections 42c and the connecting section 43c are disposed in substantially the same position in the projecting direction Z.

That is, the terminal connecting sections 42c and the connecting section 43c are formed continuously without changing the positions in the projecting direction Z.

A pair of terminal connecting sections 42c connected by the connecting section 43c are formed by bending the connecting section 43c to provide at least two portions thereof which are parallel to the intersecting direction Y.

That is, the AC bus bar 4c has a shape like a bracket "]" folded back in the intersecting direction Y.

Moreover, the terminal connecting sections 42c and the connecting section 43c of the AC bus bar 4c have a constant width in the projecting direction Z.

The AC terminals 23c of the two different semiconductor modules 2 are connected to the two terminal connecting sections 42c of the AC bus bar 4c, respectively.

The two semiconductor modules 2 connected to the AC bus bar 4c are disposed so that each module adjoins in the stacking direction X.

Moreover, the AC terminals 23c of the two semiconductor modules 2 connected to the AC bus bar 4c are disposed so that each terminal adjoins side by side in the stacking direction X.

Next, a power conversion circuit in the power converter 1 is explained.

As shown in FIG. 4, the power conversion circuit 8 has six switching elements (IGBT etc.) 211 that are the semiconductor elements 21.

The diode (FWD etc.) 212 that is the semiconductor element 21 is connected in reverse-parallel to each switching element 211.

Moreover, the switching element 211 has an upper arm side switching element 211 connected to the anode bus bar 5a and an lower arm side switching elements 211 connected to the cathode bus bar 5b.

The anode bus bar 5a is connected to an anode side of the power supply (direct-current power supply) 81.

Moreover, the cathode bus bar 5b is connected to a cathode side of the power supply 81.

Moreover, the AC bus bars 4c are connected to the AC load (three phase alternating-current motor) 82.

The direct-current electric power of the power supply 81 is converted into alternating-current electric power by controlling switching operation of the switching element 211 in the semiconductor module 2, and the AC load 82 is driven using this alternating-current electric power.

Next, function and effect in the power converter 1 of the present embodiment is explained.

In the power converter 1 of the present embodiment, the connecting bus bar (AC bus bar) 4c has the plurality of terminal connecting sections 42c that connect the power terminals 23 (AC terminals 23c) of plurality of different semiconductor modules 2, and the connecting section 43c that connects terminal connecting sections 42c.

Moreover, the entirety of the connecting bus bar 4c is formed integrally.

Therefore, the power terminals 23 of the plurality of different semiconductor modules 2 can be connected to the connecting bus bars 4c without branching off the connecting bus bars 4c.

Thereby, the connecting bus bar 4c can be formed into a simple shape, and reduction of a manufacturing cost and improvement in an ease of assembly can be realized.

Moreover, the terminal connecting sections 42c and the connecting section 43c of the connecting bus bar 4c are provided alternately in the connecting bus bar 4c, and disposed in substantially the same position in a projecting direction Z of the power terminals 23.

Therefore, the terminal connecting sections 42c and the connecting section 43c can be continuously formed with the same width (width of the projecting direction Z) by connecting terminal connecting sections 42c by the connecting section 43c substantially in the same position in the projecting direction Z.

Thereby, it becomes unnecessary to fold or bend the connecting bus bar 4c in the various directions, and can avoid forming a portion with narrow width (portion with a small cross-sectional area) in the connecting bus bar 4c.

As a result, reduction of wiring resistance and inductance of the connecting bus bar 4c can be realized.

Moreover, in the present embodiment, the plurality of semiconductor modules 2 is disposed by being stacked mutually.

Further, the terminal connecting section 42c of the connecting bus bar 4c is formed in the intersecting direction Y that intersects perpendicularly in the stacking direction X and the projecting direction Z in the state where both main surfaces are facing in the stacking direction X of the semiconductor module 2.

Therefore, it becomes easy to connect the terminal connecting sections 42c of the connecting bus bar 4c by the connecting section 43c.

Thereby, the connecting bus bar 4c can be formed into a simpler shape, and reduction of the manufacturing cost and improvement in the ease of assembly can further be realized.

Moreover, the plurality of different semiconductor modules 2 connected to the connecting bus bar 4c are disposed so that each module adjoins in the stacking direction X.

Therefore, a distance between the power terminals 23 connected to the connecting bus bar 4c can be made closer and the connecting bus bar 4c can be formed into a simpler shape.

Thereby, reduction of the manufacturing cost and improvement in the ease of assembly can further be realized.

Moreover, the power terminals 23 of the plurality of different semiconductor modules 2 connected to the connecting bus bar 4c are disposed in a line along the stacking direction X.

Therefore, the connecting process of the power terminals 23 to the plurality of terminal connecting sections 42c of the connecting bus bar 4c becomes easy, and the connecting bus bar 4c can be formed into a simpler shape.

Thereby, reduction of the manufacturing cost and improvement in the ease of assembly can further be realized.

In addition, the power terminals 23 may be disposed so that each of the power terminals 23 adjoins in the stacking direction, or may be disposed so that each of the power terminals 23 does not adjoin (disposing alternately, for example).

Moreover, in the connecting section 43c of the connecting bus bar 4c and the pair of terminal connecting sections 42c connected by the connecting section 43c, the connecting section 43c is formed by bending one of the terminal connecting sections 42c in the stacking direction X, and another one of the terminal connecting sections 42c is formed by bending to one of the terminal connecting sections 42c side from the connecting section 43c in the intersecting direction Y.

Therefore, the shape of the connecting bus bar 4c becomes the shape like the bracket "]" (or repetition of the shape "]").

Thereby, the connecting bus bar 4c can be formed into a very simple shape, and reduction of the manufacturing cost and improvement in the ease of assembly can further be realized.

Moreover, since it becomes easy to bend the connecting bus bar 4c having the same width to form the terminal connecting sections 42c and the connecting section 43c, reduction of wiring resistance and inductance of the connecting bus bar 4c can further be realized.

Moreover, the connecting bus bar 4c is the AC bus bar connected to the AC load 82.

Therefore, it is easy to realize the composition that the plurality of power terminals 23 connected to the connecting bus bars 4c are disposed in line adjoining each other in the stacking direction X like the present embodiment.

In addition, the connecting bus bars 4c may be a cathode bus bar connected to the cathode side of the power supply, or an anode bus bar connected to the anode side of the power supply.

Thus, according to the present embodiment, the power converter 1 that can realize reduction of the manufacturing cost and improvement in the ease of assembly, and can also realize reduction of wiring resistance and inductance of the bus bar can be provided.

It should be appreciated that, in the following embodiments, components identical with or similar to those in the first embodiment are given the same reference numerals for the sake of omitting explanation.

[Second Embodiment]

Figure 5:
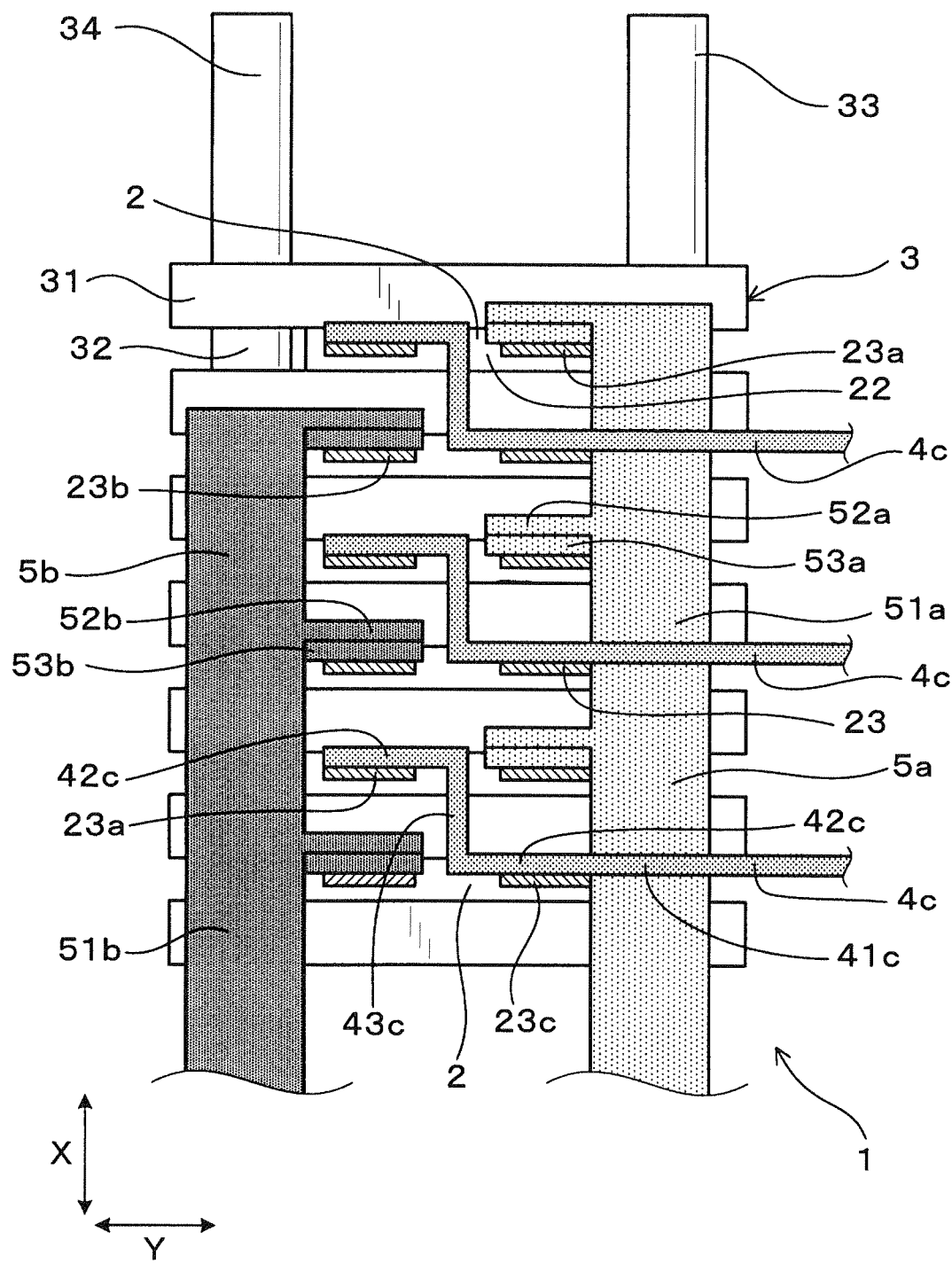
FIG. 5 shows a plan view of an entire structure of a power converter in a second embodiment.
Figure 6:
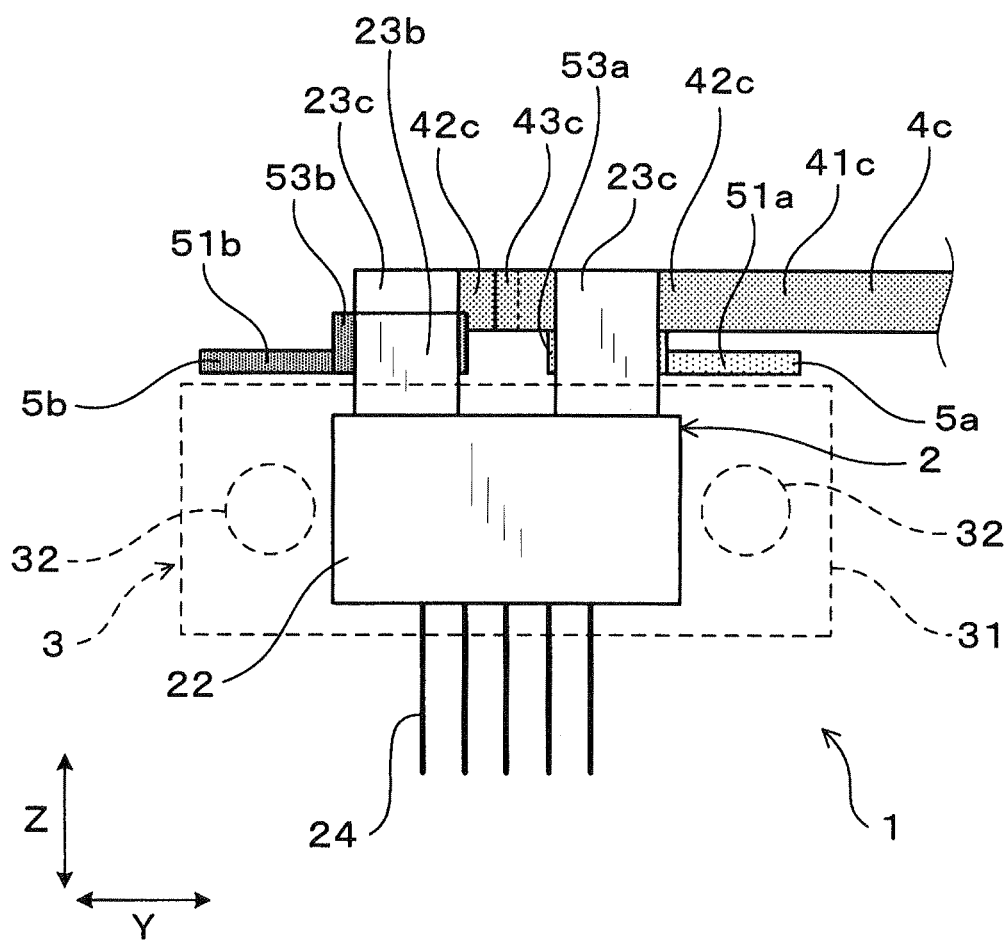
FIG. 6 shows a diagram of the power converter seen from one side in a stacking direction in the second embodiment.
Figure 7:
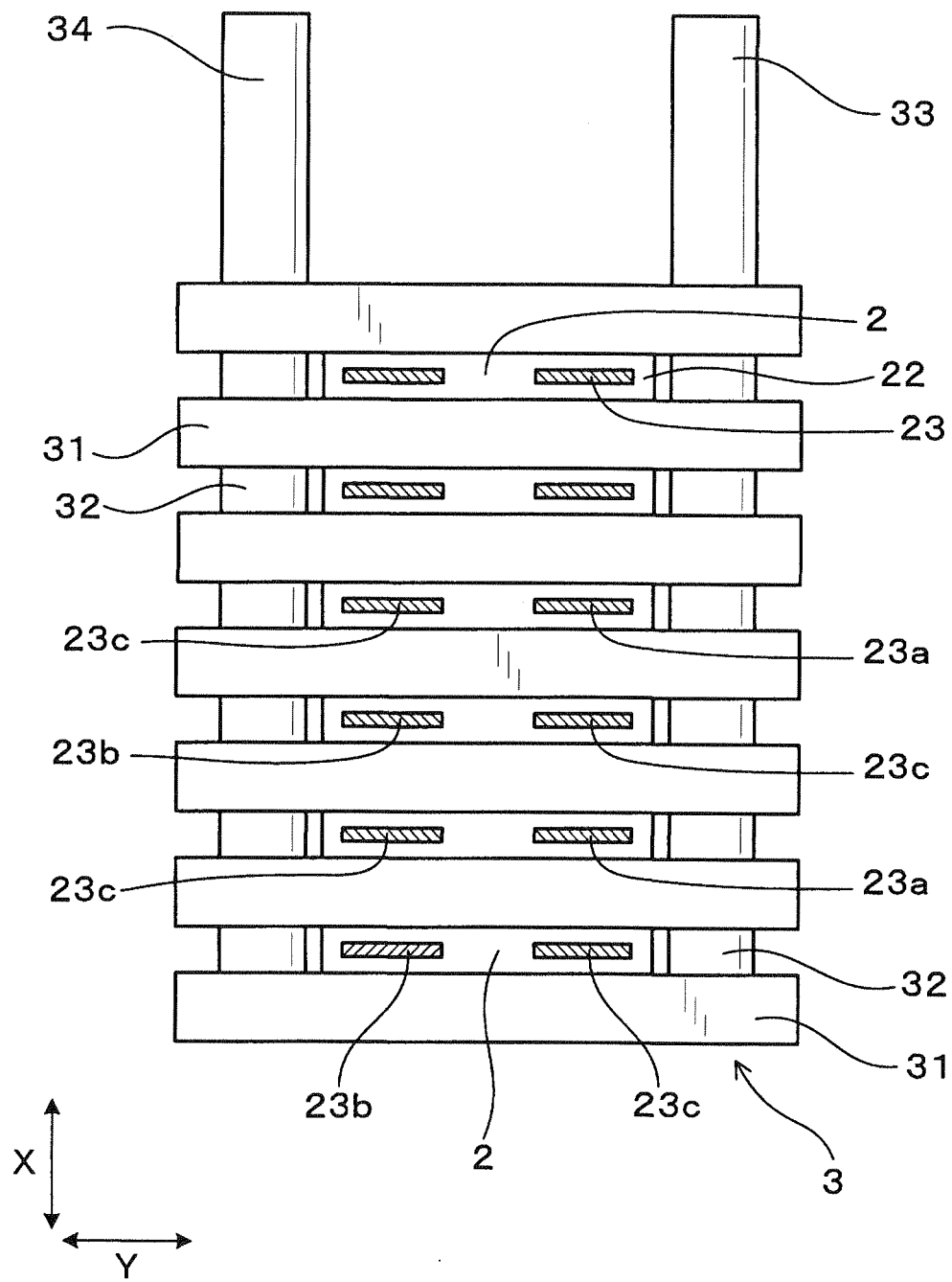
FIG. 7 shows plan views of a semiconductor module and a cooler in the second embodiment.

The second embodiment is an example that the composition of the bus bar etc. is changed, as shown in FIG. 5 to FIG. 7.

In addition, the connecting bus bar of the present embodiment is the AC bus bar 4c.

As shown in FIG. 7, in the plurality of semiconductor modules 2, the anode terminals 23a and the AC terminals 23c in one side of the intersecting direction Y are disposed alternately in one line in the stacking direction X.

Moreover, in another side of the intersecting direction Y, the cathode terminals 23b and the AC terminals 23c are disposed alternately in one line in the stacking direction X.

As shown in FIG. 5 and FIG. 6, the anode bus bar 5a is disposed at one side in the intersecting direction Y, and the cathode bus bar 5b is disposed at another side in the intersecting direction Y.

The anode terminals 23a of the semiconductor modules 2 are connected to the standing portions 53a of the anode bus bar 5a.

Moreover, the cathode terminals 23b of the semiconductor modules 2 are connected to the standing portions 53b of the cathode bus bar 5b.

The pair of terminal connecting sections 42c connected by the connecting section 43c of the AC bus bar 4c are formed by bending the connecting section 43c to provide at least two portions thereof which are parallel in the opposite sides to each other in the intersecting direction Y.

Moreover, the AC bus bar 4c is disposed so that a part of it overlaps with the anode bus bar 4a in the projecting direction Z.

Further, the width in the projecting direction Z of the terminal connecting section 42c and the connecting section 43c of the AC bus bar 4c are constant.

The AC terminals 23a of the two different semiconductor modules 2 are connected to the two terminal connecting sections 42c of the AC bus bar 4c, respectively.

The two semiconductor modules 2 connected to the AC bus bar 4c are disposed so that each module adjoins in the stacking direction X.

Moreover, the AC terminals 23c of the two semiconductor modules 2 connected to the AC bus bar 4c are disposed so that each terminal adjoins side by side in the stacking direction X.

That is, positions of the AC terminals 23c in the intersecting direction Y are shifted, and the AC terminals 23c are disposed in a different line mutually.

Other fundamental composition is the same as that of the first embodiment.

Next, function and effect of the present embodiment is explained.

The plurality of different semiconductor modules 2 connected to the AC bus bars 4c that are the connecting bus bars are disposed so that each module adjoins in the stacking direction X.

Therefore, a distance between the power terminals 23 (AC terminals 23c) connected to the connecting bus bar 4c can be made closer and the connecting bus bar 4c can be formed into a simpler shape.

Thereby, reduction of the manufacturing cost and improvement in the ease of assembly can further be realized.

The other fundamental function and effect are the same as those of the first embodiment.

[Third Embodiment]

Figure 8:
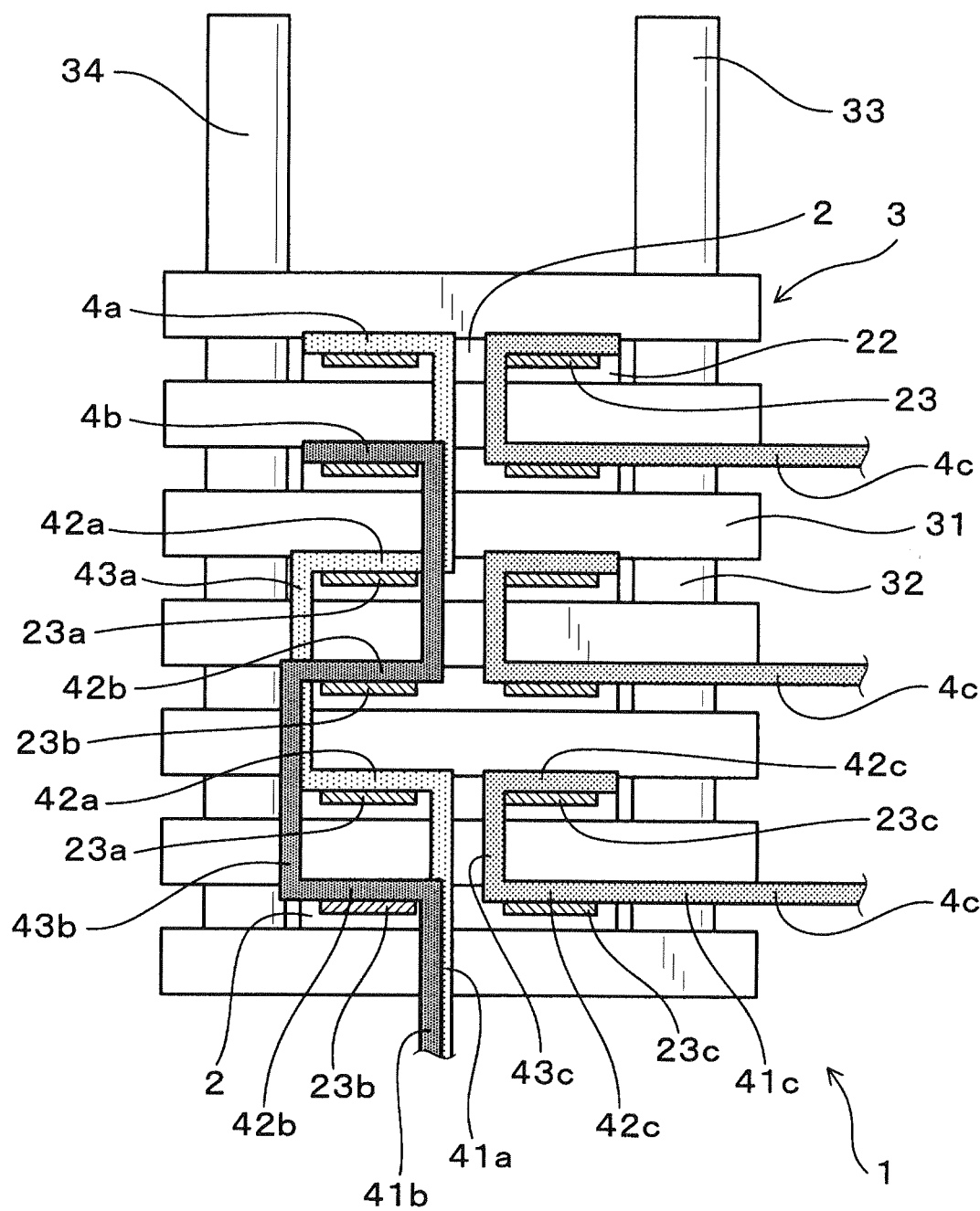
FIG. 8 shows a plan view of an entire structure of a power converter in a third embodiment.
Figure 9:
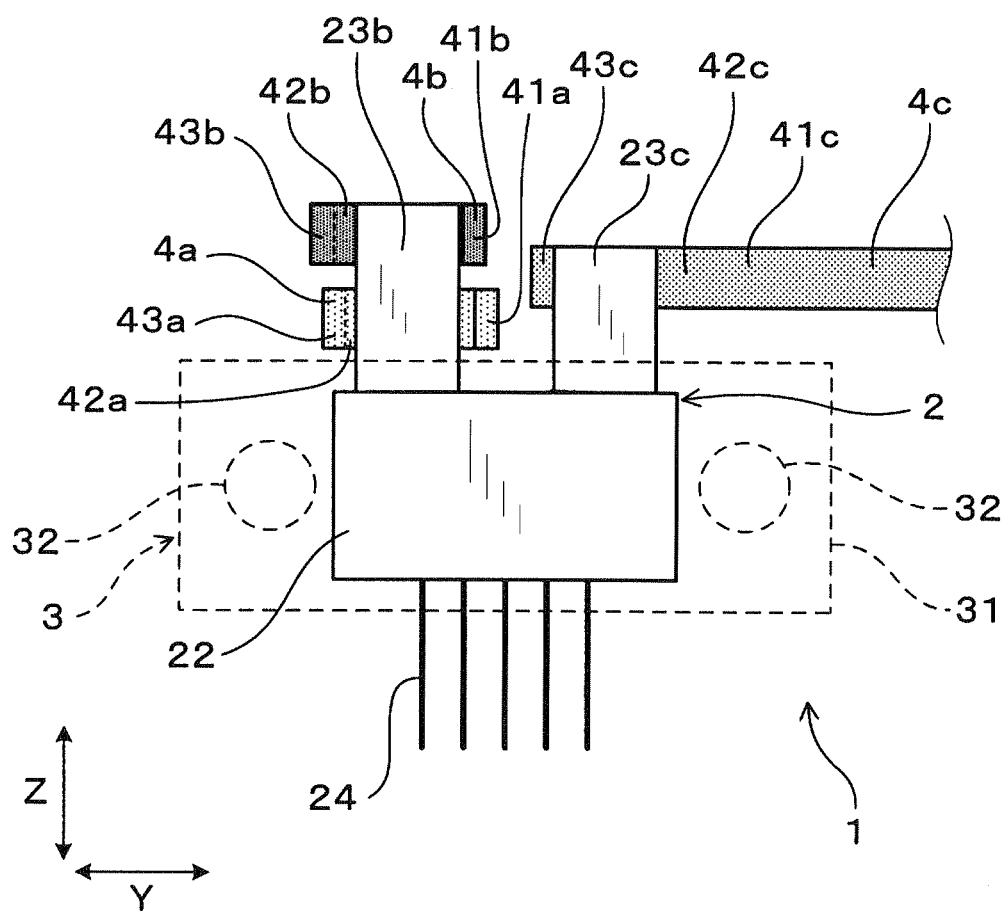
FIG. 9 shows a diagram of the power converter seen from one side in a stacking direction in the third embodiment.

The third embodiment is an example that the composition of the bus bar etc. is changed, as shown in FIG. 8 and FIG. 9.

In the plurality of bus bars, there are the anode bus bar 4a connected to the anode side of the power supply 81, the cathode bus bar 4b connected to the cathode side of the power supply 81, and the three AC bus bars 4c connected to the AC load 82 (refer to FIG. 4 for the power supply and the AC load).

In addition, the connecting bus bars of the present embodiment are the anode bus bar 4a, the cathode bus bar 4b, and the AC bus bar 4c.

The anode bus bar 4a has the main body section 41a, the three terminal connecting sections 42a that connect the anode terminals 23a of the three different semiconductor modules 2, respectively, and the two connecting sections 43a that connect the terminal connecting sections 42a.

Moreover, the entirety of the anode bus bar 4a is formed integrally.

That is, the main body section 41a, the terminal connecting section 42a, the connecting section 43a, the terminal connecting section 42a, the connecting section 43a, and the terminal connecting section 42a continue in this order to form the anode bus bar 4a.

The three terminal connecting sections 42a are formed in the intersecting direction Y with both main surfaces facing in the stacking direction X.

The two connecting sections 43a are formed in the stacking direction X with both main surfaces facing in the intersecting direction Y.

Moreover, the terminal connecting sections 42a and the connecting sections 43a are disposed in substantially the same position in the projecting direction Z.

That is, the terminal connecting sections 42a and the connecting sections 43a are formed continuously without changing the positions in the projecting direction Z.

A pair of terminal connecting sections 42a connected by the connecting section 43c of the anode bus bar 4a are formed by bending the connecting section 43a to provide at least two portions thereof which are parallel to the intersecting direction Y.

That is, the AC bus bar 4a has a shape being folded back for a plurality of times in the intersecting direction Y.

Moreover, the terminal connecting section 42a and the connecting section 43a of the anode bus bar 4a have a constant width in the projecting direction Z.

The anode terminals 23a of the three different semiconductor modules 2 are connected to the three terminal connecting sections 42a of the anode bus bar 4a, respectively.

The three semiconductor modules 2 connected to the anode bus bar 4a are disposed in the stacking direction X alternately.

Moreover, the anode terminals 23a of the three semiconductor modules 2 connected to the anode bus bar 4a are disposed in one line in the stacking direction X alternately.

The cathode bus bar 4b has the main body section 41b, the three terminal connecting sections 42b that connect the cathode terminal 23b of the three different semiconductor modules 2, respectively, and the two connecting sections 43b that connect the terminal connecting sections 42b.

Moreover, the entirety of the cathode bus bar 4b is formed integrally.

That is, the main body section 41b, the terminal connecting section 42b, the connecting section 43b, the terminal connecting section 42b, the connecting section 43b, and the terminal connecting section 42b continue in this order to form the cathode bus bar 4b.

In addition, the shape of the cathode bus bar 4b is the same as that of the anode bus bar 4a mentioned above.

Moreover, the cathode bus bar 4b is disposed so that a part of it overlaps with the anode bus bar 4a in the projecting direction Z.

The cathode terminals 23b of the three different semiconductor modules 2 are connected to the three terminal connecting sections 42b of the cathode bus bar 4a, respectively.

The three semiconductor modules 2 connected to the cathode bus bar 4b are disposed in the stacking direction X alternately.

Moreover, the cathode terminals 23b of the three semiconductor modules 2 connected to the cathode bus bar 4b are disposed in one line in the stacking direction X alternately.

Other fundamental composition is the same as that of the first embodiment.

Next, function and effect of the present embodiment is explained.

The anode bus bar 4a that are the connecting bus bars and the power terminals 23 (the anode terminals 23a, the cathode terminals 23b) of the plurality of different semiconductor modules 2 connected to the cathode bus bar 4b are disposed so that each bus bar and terminal adjoins in the stacking direction X.

Therefore, the connecting process of the power terminals 23 to the plurality of terminal connecting sections 42a and 42b of the connecting bus bars 4a and 4b becomes easy, and the connecting bus bars 4a and 4b can be formed into a simpler shape.

Thereby, reduction of the manufacturing cost and improvement in the ease of assembly can further be realized.

The other fundamental function and effect are the same as those of the first embodiment.

[Fourth Embodiment]

Figure 10:
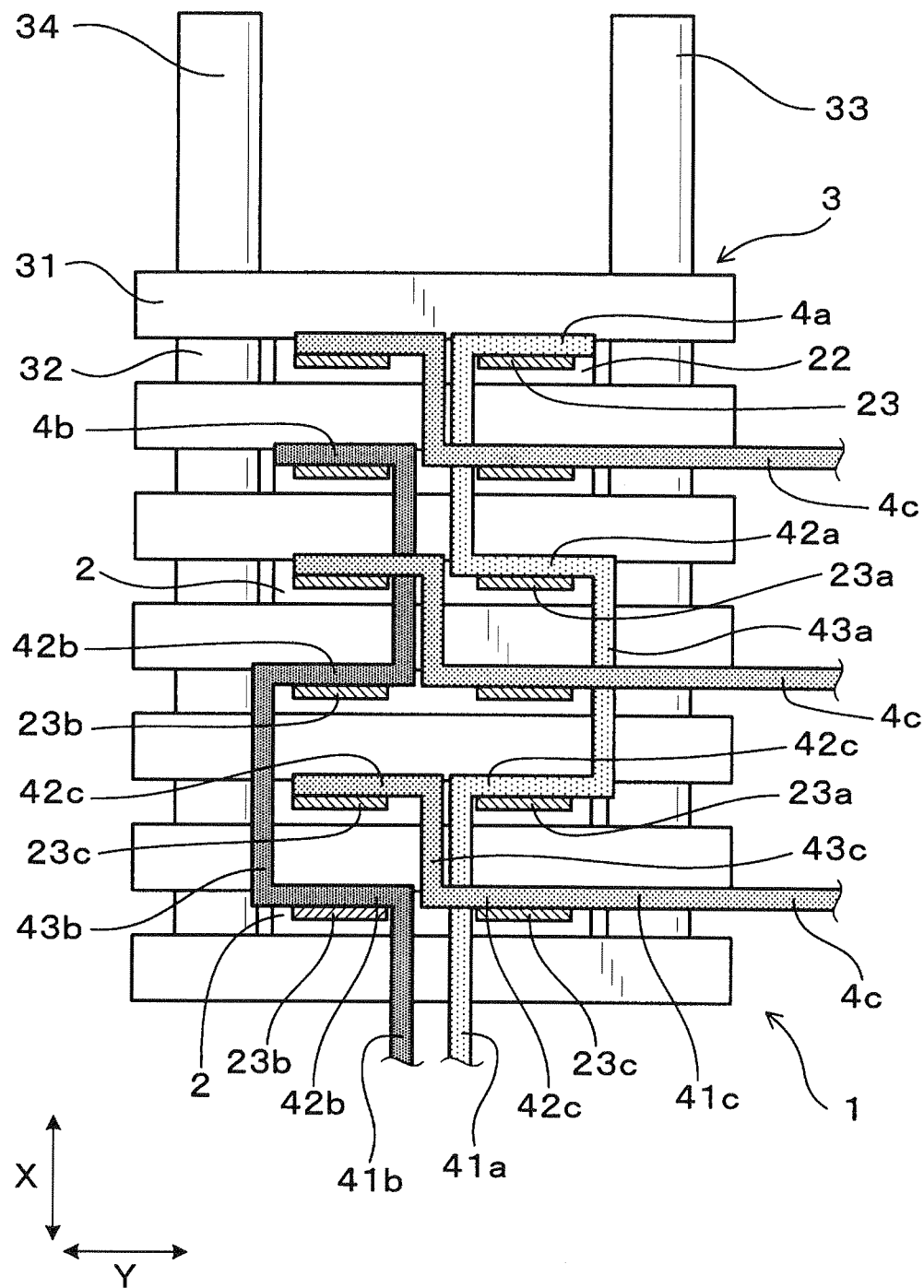
FIG. 10 shows a plan view of an entire structure of a power converter in a fourth embodiment.
Figure 11:
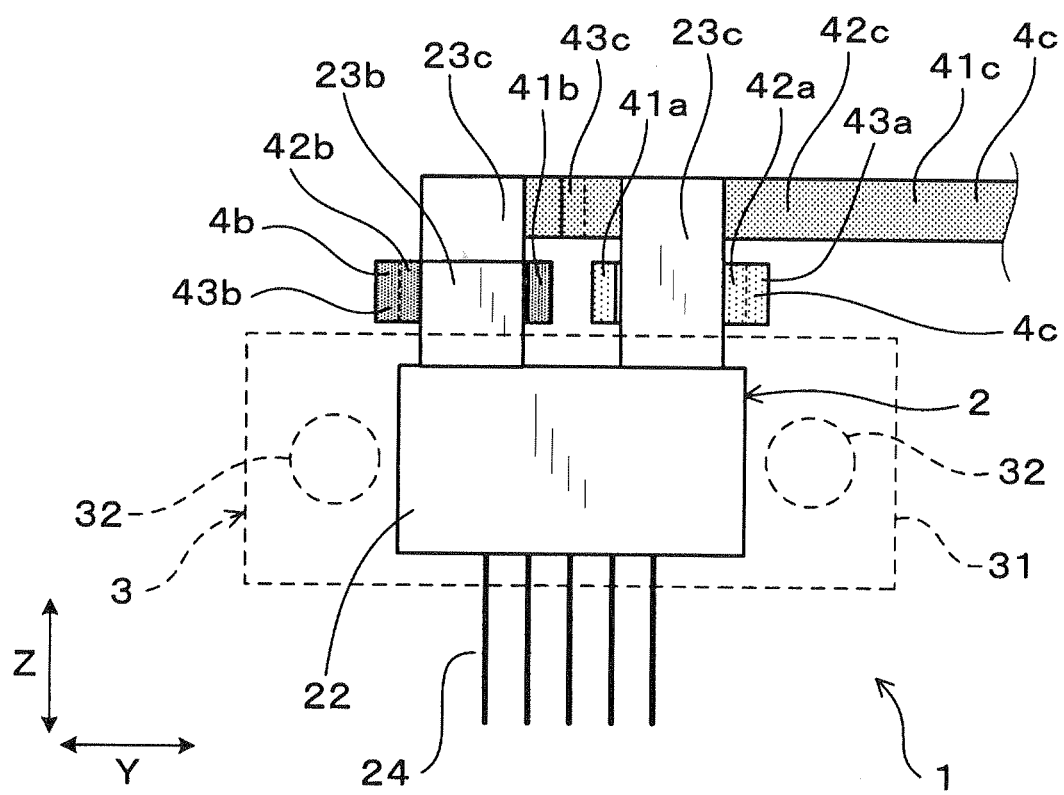
FIG. 11 shows a diagram of the power converter seen from one side in a stacking direction in the fourth embodiment.

The third embodiment is an example that the composition of the bus bar etc. is changed, as shown in FIG. 10 and FIG. 11.

In addition, the connecting bus bars of the present embodiment are the anode bus bar 4a, the cathode bus bar 4b, and the AC bus bar 4c.

The anode bus bar 4a is disposed at one side of the intersecting direction Y, and the cathode bus bar 4b is disposed at another side of the intersecting direction Y.

The shapes of the anode bus bar 4a and the cathode bus bar 4b are the same as those of the third embodiment (refer to FIG. 8).

Moreover, the anode bus bar 4a and the cathode bus bar 4b are formed symmetrically in the intersecting direction Y.

The shape of the AC bus bar 4c is the same as that of the second embodiment (refer to FIG. 5).

Moreover, in the projecting direction Z, the AC bus bar 4c is disposed so that a part of it overlaps with the anode bus bar 4a or the cathode bus bar 4b.

Other fundamental composition is the same as that of the second embodiment.

Next, function and effect of the present embodiment is explained.

The anode bus bar 4a that are the connecting bus bars and the power terminals 23 (the anode terminals 23a, the cathode terminals 23b) of the plurality of different semiconductor modules 2 connected to the cathode bus bar 4b are disposed so that each bus bar and terminal adjoins in the stacking direction X.

Therefore, the connecting process of the power terminals 23 to the plurality of terminal connecting sections 42a and 42b of the connecting bus bars 4a and 4b becomes easy, and the connecting bus bars 4a and 4b can be formed into a simpler shape.

Thereby, reduction of the manufacturing cost and improvement in the ease of assembly can further be realized.

The other fundamental function and effects are the same as those of the second embodiment.

What is claimed is:

1. A power converter comprising:
   a plurality of semiconductor modules that have main body sections, each of the main body sections has a semiconductor element therein, and power terminals projected from the main body sections; and
   a plurality of bus bars that connect the power terminals of the semiconductor modules; wherein,
   at least one of the plurality of bus bars are connecting bus bars which have a plurality of terminal connecting sections that connect the power terminals of the plurality of different semiconductor modules, and connecting sections that connect the terminal connecting sections;
   an entirety of each connecting bus bars is formed integrally; and
   the terminal connecting sections and the connecting section of every connecting bus bar are provided alternately in the connecting bus bar, and disposed in substantially the same position in a projecting direction of the power terminals.

2. The power converter according to claim 1, wherein,
   the plurality of the semiconductor modules are disposed by stacking mutually, and
   the terminal connecting section of the connecting bus bar is formed with both main surfaces facing in a stacking direction of the semiconductor module in an intersecting direction that intersects perpendicularly with the stacking direction and the projecting direction.

3. The power converter according to claim 2, wherein,
   the plurality of different semiconductor modules connected to the connecting bus bar is disposed so that each module adjoins in the stacking direction.

4. The power converter according to claim 2, wherein,
   the power terminals of the plurality of different semiconductor modules connected to the connecting bus bar are disposed in a line along the stacking direction.

5. The power converter according to claim 3, wherein,
   the power terminals of the plurality of different semiconductor modules connected to the connecting bus bar are disposed in a line along the stacking direction.

6. The power converter according to claim 2, wherein,
   the connecting section is formed in the stacking direction, and
   a pair of terminal connecting sections connected by the connecting section are formed by bending the connecting section to provide at least two portions thereof which are parallel to the intersecting direction.

7. The power converter according to claim 1, wherein,
   the connecting bus bar is an alternating-current bus bar connected to an alternating-current load.

\* \* \* \* \*